United States Patent
Hagge et al.

(10) Patent No.: US 7,733,359 B1
(45) Date of Patent: Jun. 8, 2010

(54) PIXEL STRUCTURE FOR ELECTRICAL FLAT PANEL DISPLAYS

(75) Inventors: John K. Hagge, Andover, MA (US); Dick G. Postma, Palo, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1357 days.

(21) Appl. No.: 10/941,466

(22) Filed: Sep. 15, 2004

(51) Int. Cl.
 *G09G 5/02* (2006.01)
(52) U.S. Cl. ................................ 345/695; 349/146
(58) Field of Classification Search ................ 349/144, 349/146; 345/694, 695; 359/254; 313/500
See application file for complete search history.

(56) References Cited

U.S. PATENT DOCUMENTS

| | | | |
|---|---|---|---|
| 6,624,828 B1 | 9/2003 | Dresevic et al. | 345/771 |
| 6,674,436 B1 | 1/2004 | Dresevic et al. | 345/472 |
| 2004/0169807 A1* | 9/2004 | Rho et al. | 349/139 |
| 2005/0041188 A1* | 2/2005 | Yamazaki | 349/146 |

* cited by examiner

*Primary Examiner*—Amare Mengistu
*Assistant Examiner*—Yuk Chow
(74) *Attorney, Agent, or Firm*—Matthew J. Evans; Daniel M. Barbieri

(57) ABSTRACT

The present invention is a system and method for providing trapezoidal pixel segments with peripheral interconnections to rows and columns of pixel segments for electrical flat panel display devices. Interconnections made to pixel segments are located substantially in the non-emitting space between pixels. Pixel segment area may be configured to correspond to a desired luminous intensity for individual pixels. Luminous intensity may be determined from user, machine or process identified criteria.

5 Claims, 11 Drawing Sheets

PIXEL STRUCTURE FOR ELECTRICAL FLAT PANEL DISPLAYS

FIELD OF THE INVENTION

This invention relates generally to electrical displays and more particularly to electrical displays with z-axis interconnections between electrical driver circuitry and electrically driven display elements.

BACKGROUND OF THE INVENTION

Electrical flat panel displays are becoming evermore popular as a result of improved image quality and reduced form factor over conventional displays. Images viewed on flat panel displays such as OLED and LCD displays are comprised of thousands of pixels having a similar shape, arranged in rows or columns across a display screen. A pixel is a single sample or element of an image located at specific spatial coordinates on a display. Pixels in color displays generally consist of three segments, one red, one green and one blue, which, when observed from beyond a certain distance, blend together and appear as one single color.

An optimum pixel arrangement for color displays is generally referred to as a delta triad arrangement. A delta triad pixel 100 is comprised of three equal area red, green and blue (RGB) pixel segments, such as squares arranged such that each pixel segment contacts the other two, as shown in an exemplary fashion in FIG. 1A. Delta triad pixels produce high resolution, high quality images due to minimized distortion and maximized blending resulting from pixel segments being in contact with one another. The order of the segments may be rotated in various geometries and replicated to cover an area of a display screen.

Referring to FIG. 1B, a delta triad pixel array 110 is shown. Because of the configuration of individual delta triad pixels, a delta triad pixel array 110 leaves blank areas 120 around the perimeter of the display. If a single image covers a substantial portion of a display area, a bezel may cover the blank space. However, in certain instances a zero-bezel display area may be desired, such as when tiling smaller displays together in a mosaic pattern to create a larger display. Blank spaces along the borders of the smaller tiled displays may create undesirable visual effects and poor image quality. As a result, a delta triad pixel array 110 is not desirable for images requiring zero-bezel display areas.

One solution to remove blank edge space is the use of a repetitive pattern of rectangular pixels, used in many flat panel displays. However, the conventional approach of dividing each rectangle into adjacent red, green and blue equal area rectangular segments may compromise the desirable optical effects of the delta triad, because the color segments are no longer in proximity to all other colors, as shown in an exemplary fashion in FIG. 2. For example, in a typical rectangular RGB pixel array 200, the red segment 210 no longer contacts the blue 220 segment, and this may result in a degraded image quality.

Another problem associated with zero-bezel displays is the placement of connections to pixels. In displays with bezels, connections may be placed around the edges of the display making connection in the display's x axis along the left and/or right edges of the display, and, the display's y-axis along the display's top and/or bottom edges without affecting the appearance of the display. Alternatively, one approach to enhancing zero-bezel displays is to make connections to pixel rows and columns in the z-axis out the back of the display panel, instead of only around the edges of a display. Referring to FIG. 3, a pixel array 300 with conventional z-axis interconnections 320 disposed on an interconnecting surface 310 known to the art is shown. Each pixel segment may utilize an interconnection which controls the luminous intensity of the pixel.

However, a problem with conventional z-axis interconnections is blockage of the desired pixel area due to the placement of the interconnection on the surface of a pixel or pixel segment. Similarly, because the pixel material which gives off light is also located at the site of the interconnection, the interconnecting surface 310 blocks some of the emitted light from passing through to the viewer.

The amount of emitted pixel light blocked by an interconnection depends upon the ratio of the interconnection area to the pixel area. Unfortunately, due to the practical manufacturing tolerances required for layer alignment and processing, interconnections usually require too much area on the pixel segment resulting in a degraded image to the viewer. Similarly, on high resolution displays, the dimensions of the space required for interconnection may exceed the desired width of the pixel segment due to manufacturing tolerances.

Consequently, it would be advantageous if a system and method existed which utilized z-axis interconnections that did not compromise pixel image quality while allowing the full display to be viewed with zero space lost to, a perimeter bezel or blank display areas.

SUMMARY OF THE INVENTION

Accordingly, the present invention is directed to a system and method of designing controllable pixel segments and uses z-axis interconnections whereby the area of each pixel segment may be adjusted to achieve overall improved pixel image quality.

In accordance with the present invention, individual pixel areas are comprised of adjacent segments, each of a different color. When combined, the pixel segments may form generally rectangular or trapezoidal shapes allowing for full coverage of a display. Individual pixel segments are generally trapezoidal, and the area of each segment may be modified to even out the luminous intensity of a pixel without losing desired overall pixel shape and size. Pixels may be arranged horizontally, vertically or the like on a pixel grid. Metal pads for z-axis interconnections may be placed on the pixel grid along elongated pixel segment edges such that some of the pad area is located in the non-emitting space between rows or columns of pixels. The metal pads are designed to minimize overlap into a pixel area, blocking only a small percentage of a pixel segment from pixel light transmission.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

Those numerous objects and advantages of the present invention may be better understood by those skilled in the art by reference to the accompanying figures in which.

DETAILED DESCRIPTION OF THE INVENTION

Reference will now be made in detail to presently preferred embodiments of the invention, examples of which are illustrated in the accompanying drawings.

Figure 4A:
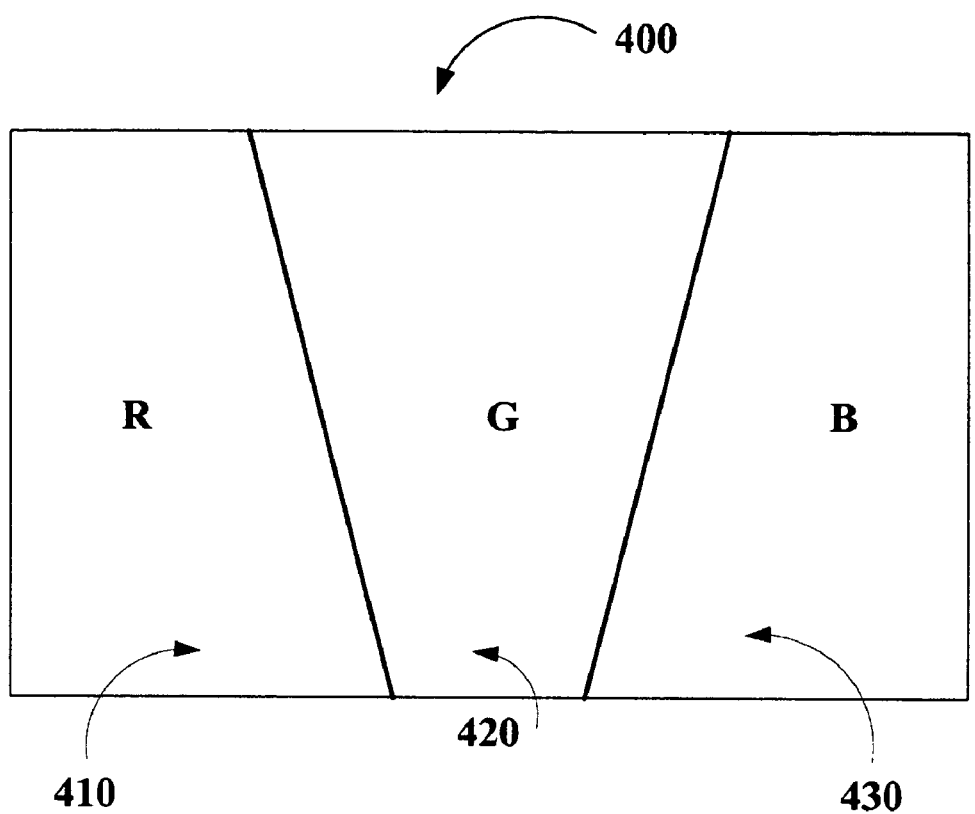
FIG. 4A depicts an embodiment of a pixel configuration utilizing shape adjustable pixel segments in accordance with the present invention.

Referring to FIG. 4A, an embodiment of a pixel configuration 400 utilizing shape configurable pixel segments 410-430 in accordance with the present invention is shown. A display comprises a plurality of pixels organized into an array. Pixels 400 may be comprised of at least three pixel segments 410-430. Each pixel segment in a discrete pixel 400 may be a different color, preferably, red, green or blue (RGB), however, pixel segments are not limited to these colors. Individual pixel segments 410-430 may be generally quadrilateral, and may be substantially trapezoidal. In a single pixel element 400, an individual pixel segment 410-430 is generally adjacent to one other segment. For example, in a discrete pixel 400, a red pixel segment 410 may be adjacent to a green pixel 420 segment, and the green pixel segment 420 may be adjacent to a blue pixel segment 430. Additionally, pixel segments 410-430 comprising a pixel 400 may be congruent or incongruent. Pixel segment shape, size and congruence are configured prior to arrangement on a display, and may be determined by the type of display, machine or process with which the pixels are utilized.

In a preferred embodiment, individual pixel segments 410-430 are generally trapezoidal. Pixel segments 410-430 may be configured to minimize the distance between the outer two pixel segments 410, 430 while maintaining a generally rectangular or trapezoidal overall pixel shape. For example, at least two pixel segments in a discrete pixel 400 may be configured to have a longer base leg located along one edge of the pixel 400, and at least one pixel segment may be configured to have a longer base leg located along a second, generally opposite, pixel edge. The resultant overall pixel shape may be substantially rectangular/square or moderately trapezoidal, allowing for arrangement of pixels to the edges of a display. A trapezoidal shaped pixel may overlap the normal vertical edge of a square pixel triad by a percentage. An adjacent trapezoidal pixel may extend across the vertical pixel area into the area of a first pixel triad, enhancing color pixel triad blending and producing improved color.

The ratios of the areas of the generally trapezoidal pixel segments that form a single pixel may be adjusted to compensate for particular characteristics of each pixel emitter. Pixel segments of different colors generally emit light at different intensities. For example, a common ratio of luminous intensities is 60 percent green emission, 30 percent blue emission, and 10 percent red emission in congruent pixel segments. Luminous intensity ratios may vary depending upon the method and type of material utilized for generating pixel segments.

An OLED pixel display may utilize any of a variety of organic materials that emit light when an electric current is applied to the organic materials. Configuration of pixel segments may depend on the type of material utilized in the display device to generate pixels. For example, green light may be generated by doping the emitting material with a small amount of an iridium phosphor or fluorescent dye. This results in generally high luminous intensity, or a bright level of light emission for green pixel segments. Red light may be achieved from lanthanide complexes or porphyrin pigments doped into the emitting material of an OLED display, resulting in a generally dimmer luminous intensity. Blue light may be achieved from perylene pigment doped into the emitting material of an OLED display, resulting in a luminous intensity level somewhere between red emission and green emission. Pixel segment area adjustment in accordance with the present invention is similarly compatible with and suitable for other methods for generating pixel light emission which may produce similar disparities in luminous intensity. The design may also be used when fabricated by ink-jet or color filter photolithography methods.

An overall luminous intensity for each pixel, as determined by user identified criteria, may be desired. In an embodiment of the invention, a ratio of pixel segment areas corresponding to the desired luminous intensity may then be determined, and the area of a pixel segment may be increased or decreased in the initial design stage to even out the relative brightness of each pixel, and eliminate color to color variations in light emission without reducing local area for z-axis via connections to drivers. The area of at least one of a second or third pixel segment in a discrete pixel may be decreased to obtain the pixel's desired luminous intensity, while maintaining a desired shape and area for each pixel.

Figure 4B:
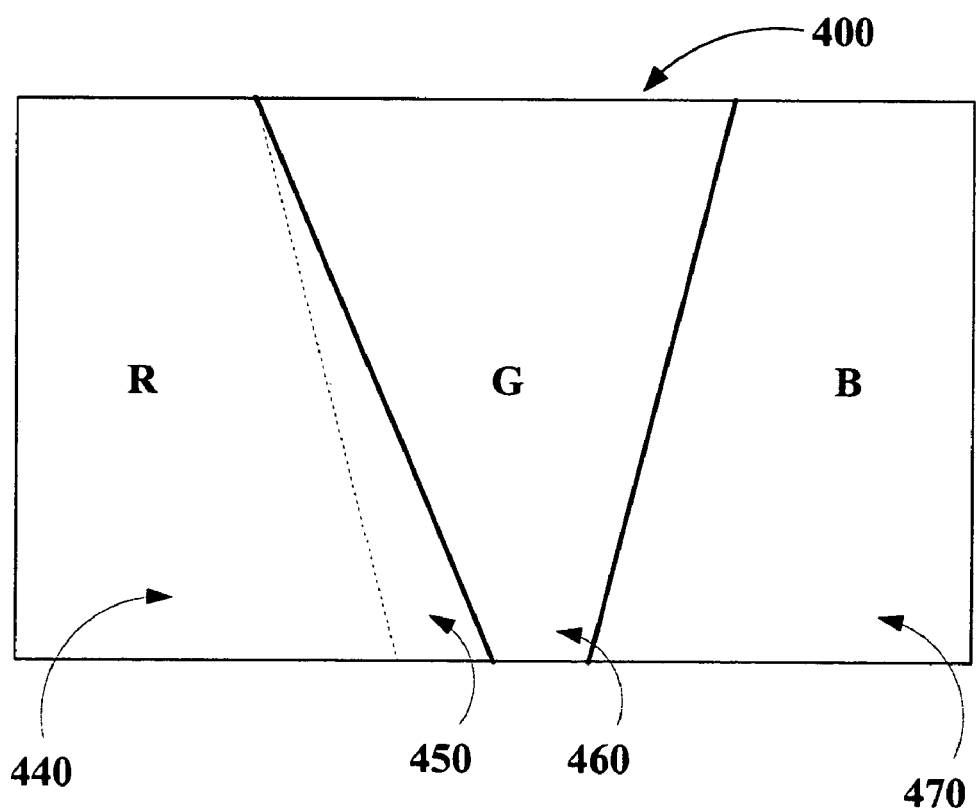
FIGS. 4B and 4C depict embodiments of pixels with area adjusted pixel segments in accordance with the present invention.

Referring to FIG. 4B, a pixel 400 with area adjusted pixel segments 440-470 in accordance with the present invention is shown. A lateral edge shared by two segments may be elongated and extended along an edge of a pixel 400. For example, the luminous intensity of a red pixel segment 440 may be increased by expanding a base edge of the red pixel segment 440. Increasing the length of a base edge of the red pixel segment 440 increases its area an amount 450. This in turn increases the luminous area of the red pixel segment 440. The area of an adjacent pixel segment 460 may be simultaneously decreased by the reduction in width of the adjacent pixel segment base edge. The area of the blue pixel segment 470 may stay substantially the same.

Figure 4C:
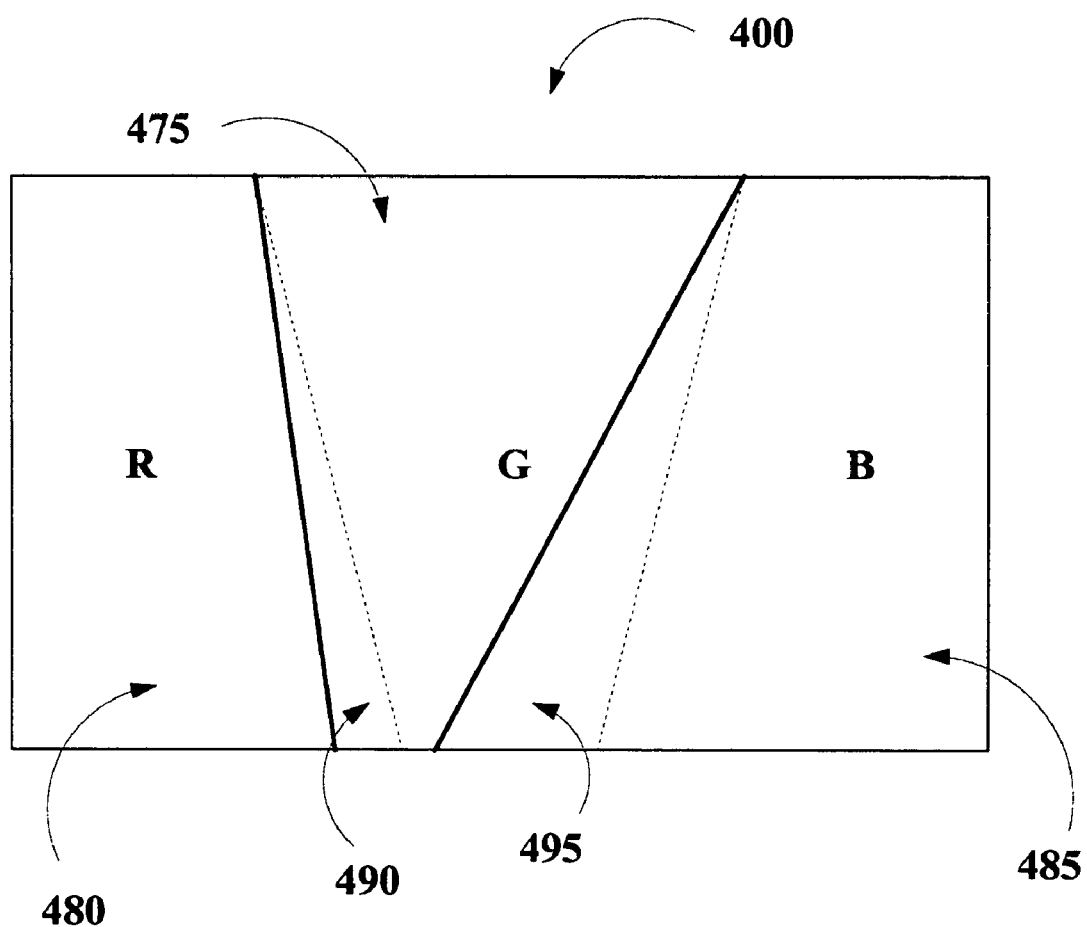

More than one pixel segment area may be adjusted, as is shown in an exemplary fashion in FIG. 4C. The area of the red pixel segment 480 may be decreased by an amount 490, and the area of the blue pixel segment 485 may be increased by an amount 495, further resulting in a net decrease of the area of the green pixel segment 475 while maintaining the overall shape and size of the pixel 400.

An advantageous aspect of a display in accordance with the present invention is that displays are not limited by a specific required pixel width to accommodate interconnections. Pixel segment areas may be adjusted to comport with the requirements of a particular machine or process. For example, in certain processes, the width of the metal pad for interconnection may exceed the width of a pixel segment. This is especially true on high resolution displays such as OLED displays.

Figure 5:
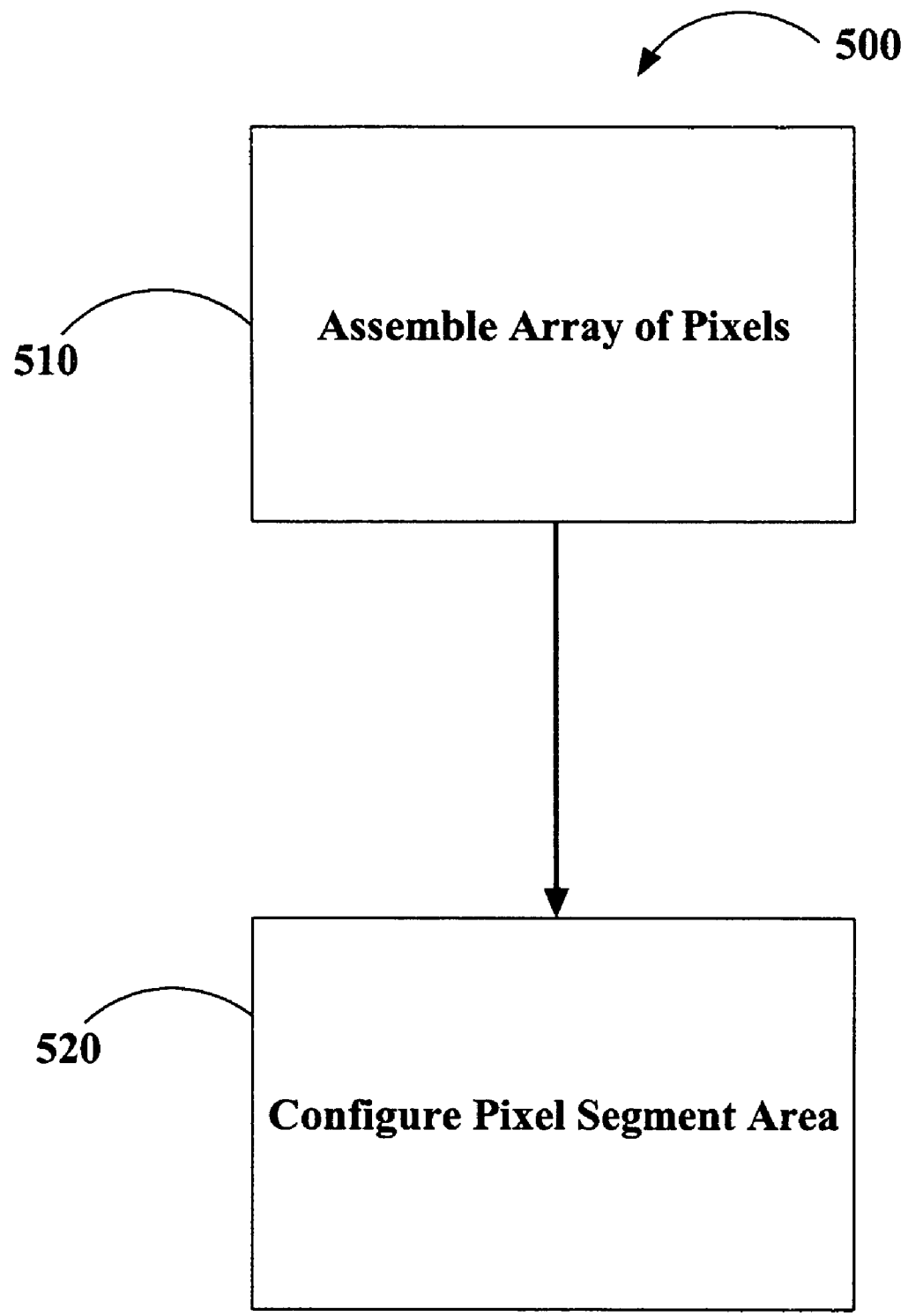
FIG. 5 is a flowchart of a method for displaying an image in accordance with the present invention.

Referring to FIG. 5, a method 500 for displaying an image in accordance with the present invention is shown. Method 500 may begin upon assembling an array of pixels 510. Pixel arrays may be arranged and assembled for full display area coverage, with pixel segments continuing to the edges of a display. Next pixel segment area may be configured 520 in the initial design to be proportionately larger, by increasing the length of one pixel segment base edge to accommodate a larger metal pad and minimize blockage resulting from an interconnection. It is contemplated that pixel segment area may be configured as described with respect to FIGS. 4B and 4C. Advantageously, configuring pixel segment areas may provide a desired overall luminous intensity for a particular pixel.

Figure 6:
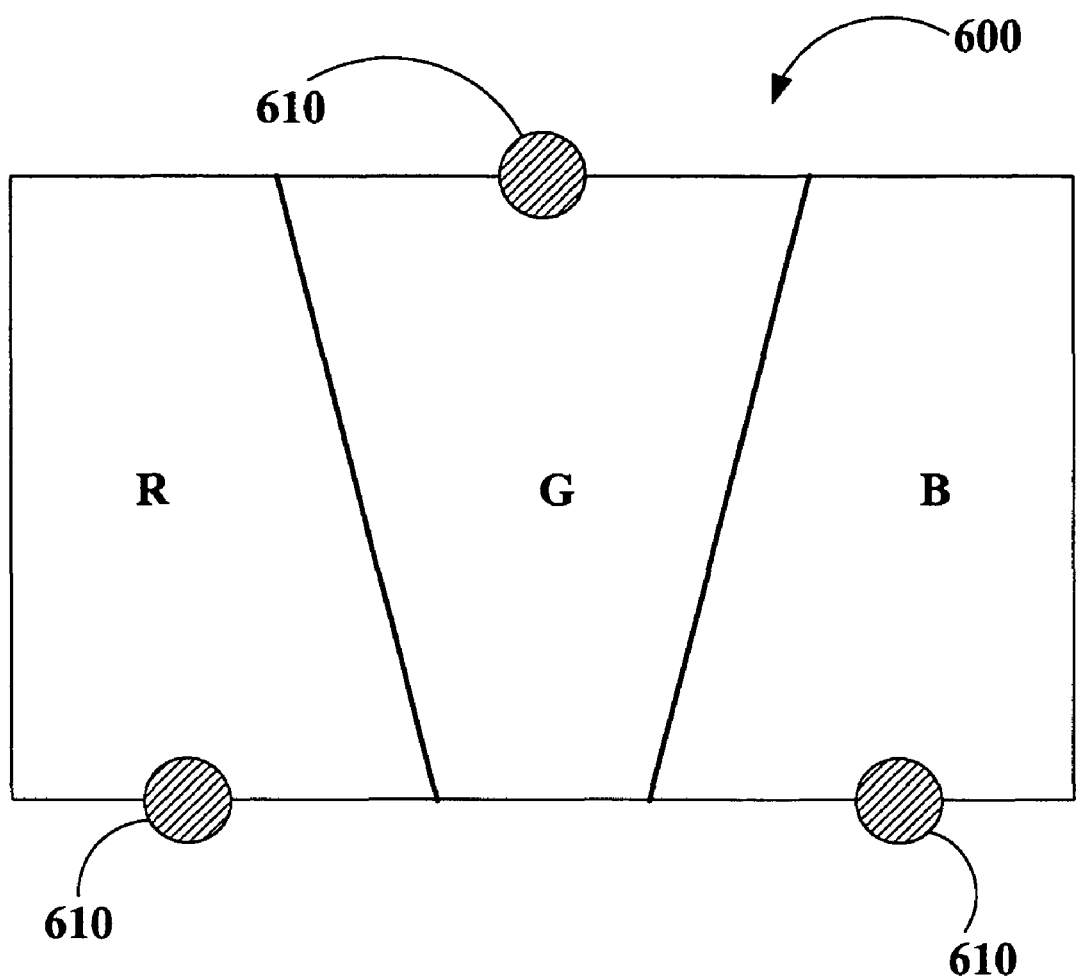
FIG. 6 depicts an embodiment of a 3-segment pixel and shows where the z-axis interconnections may be located along the border edges of pixel segments in pixel triad rows and columns in accordance with the present invention.

Referring now to FIG. 6, an embodiment of a pixel 600 with possible locations for z-axis interconnections along the border edges of trapezoidal pixel segments RGB in accordance with the present invention is shown. The design of the metal pad 610 may be determined by the process or device for which a pixel array is utilized. Additionally, the size of the metal pad may be adjusted depending upon the location of the metal pad on a display. For instance, larger metal pads may be placed within the interior region of a display to provide a larger target area for the via. Smaller metal pads may be placed along the edges of a display in order to fit within smaller segments which may be necessary for zero bezel displays. If desired, a side of an individual pixel segment may be adjusted to accommodate a larger metal pad 610. This is advantageous as high resolution displays often require metal pads which exceed the desired width of a segment interconnection due to manufacturing tolerances. Placement of the metal pads 610 along the longer edge of a pixel segment is advantageous since it reduces the segment area blocked by the pad 610.

Figure 7:
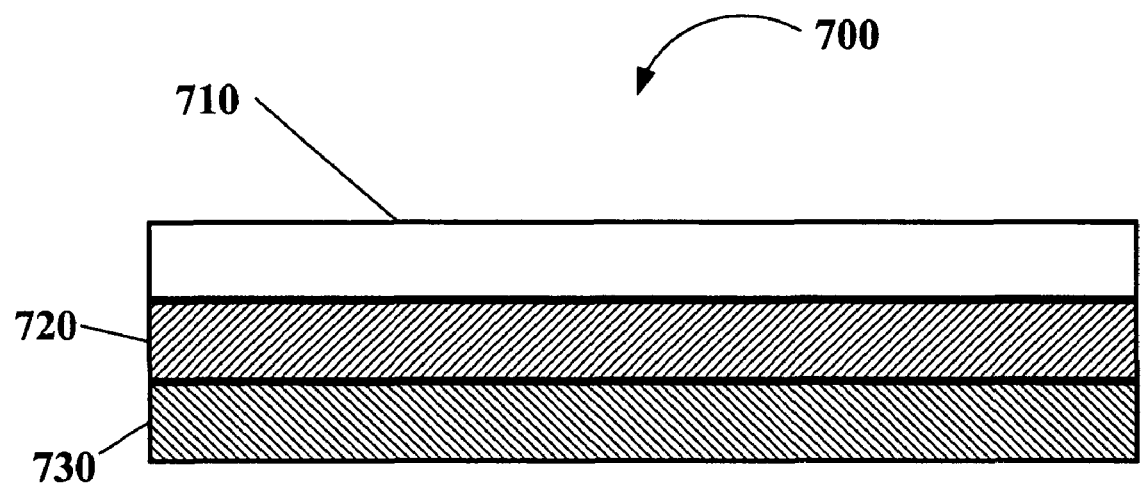
FIG. 7 depicts an embodiment of a display configuration in accordance with the present invention.

Referring now to FIG. 7, a display configuration 700 in accordance with the present invention is shown. A display configuration 700 is generally comprised of a first substantially planar transparent substrate 710 and a second substantially planar substrate 720. The first substrate 710 may function as an anode for the display, and the second substrate 720 may function as a cathode. In one embodiment, the substrate 710, operating as an anode, may be a high work function material such as a transparent thin film of indium titanium oxide (ITO), indium zinc oxide (IZO), platinum (Pt), gold (Au), nickel (Ni) or the like. The substrate 720, operating as a cathode, may be a generally opaque reflective low work function metal such as an alkaline earth metal, reactive metal alloy, or co-doped zinc oxide. Additionally, at least one insulating dielectric layer 730 is positioned over the columns and pixel and row structures on the backside of the display panel.

Pixels may be illuminated by electrically connecting rows and columns, substrate 710 and substrate 720 to an external drive circuit. A display consists of pixel triads that exist at the intersection of these rows and columns. Each column and row may be individually driven. Display columns may be divided such that generally the top half of columns intersect the top half of rows, and the bottom half of columns intersect the bottom half of rows. A pixel array comprised of individual pixel triads is configured generally between the substrate 710 and substrate 720. Pixel segments may exist at the intersection of each driven row and column. In the present embodiment, an electrical connection to a driver may be made by a via to a metal pad deposited on the substrate, aligned along an edge of the pixel segment, minimizing segment blockage and maximizing the luminous area of the segment. A metal via for interconnection is created through an insulating dielectric layer 730 onto the peripherally positioned metal pad. The via may connect column segments RGB to drivers that control pixel illumination and switch pixel segments RGB on/off. Each combination of red, blue and green of a triad may be turned on/off to create a desired color. A display device 700 may have peripheral interconnections to pixel segments which are separated by an amount of non-emitting shadow mask space existing between rows and columns, and may contain an interconnection.

Figure 8:
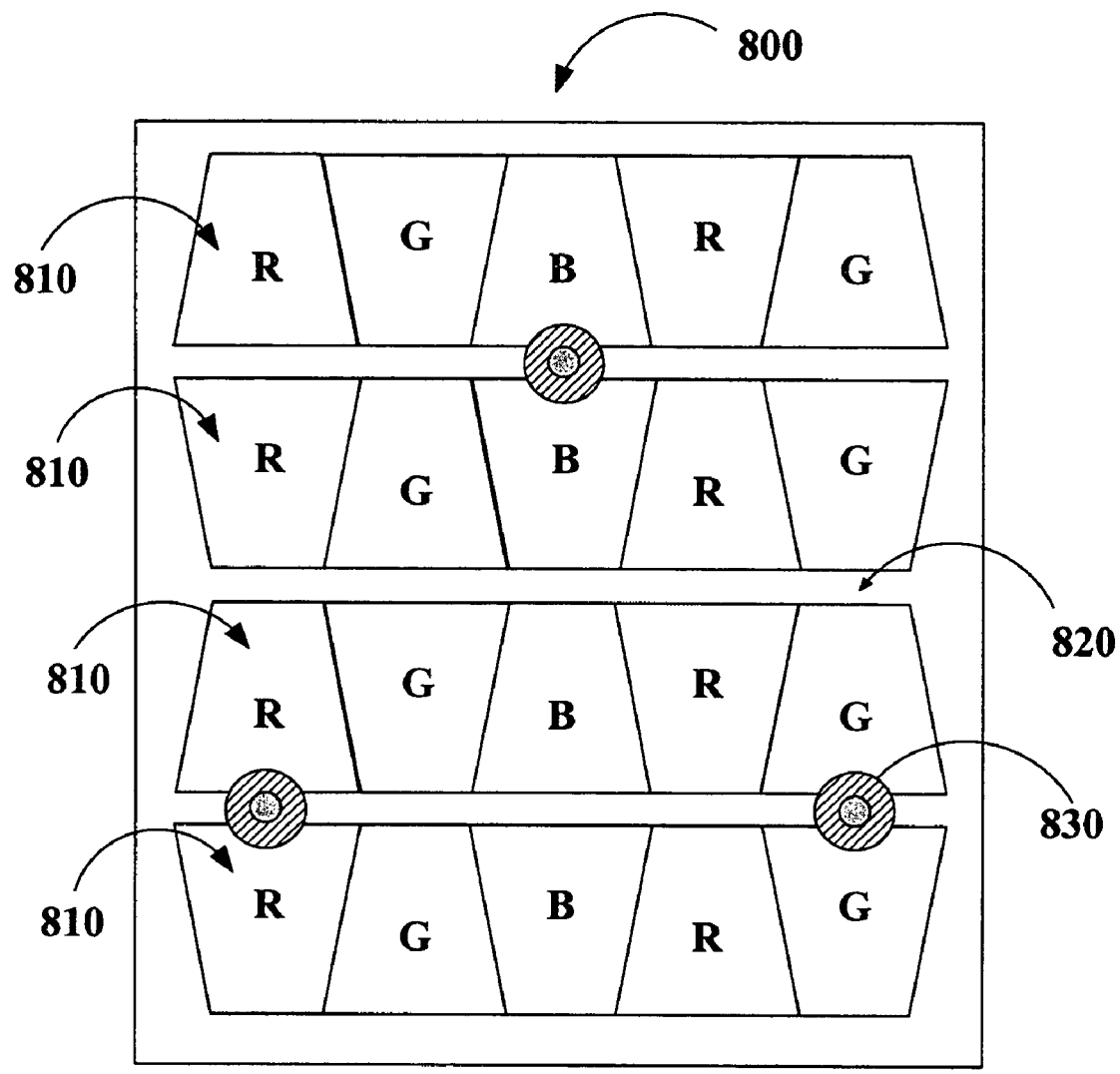
FIG. 8 depicts an embodiment of a pixel array with z-axis interconnections along the border edges of pixel segments in accordance with the present invention.

Referring to FIG. 8, an embodiment of an array of rows and columns of pixels 800 with z-axis interconnections in accordance with the present invention is shown. Between each horizontal row of pixels 810 in this OLED display is a shadow mask 820, where no pixel light is transmitted. The space 820 generally provides separation of pixel rows 810 to prevent electrical communication between pixel rows. Similarly, a shadow mask exists between each column of pixel segments (not shown) and provides separation of column segments and prevents electrical communication between columns. It is contemplated that the orientation of FIG. 8 may be rotated, for example by 90 degrees, without departing from the scope and intent of the present invention. Advantageously, a display in accordance with the present invention may have metal pads 830 centered upon the non-emitting shadow mask space between pixel rows, and upon which vias are disposed for z-axis interconnection to drivers. The metal pad 830 is placed so that some of its area is in the non-emitting space 820 between pixels, with only a small percentage of the metal pad 830 overlapping into active pixel area. The metal pad 830 is designed such that only a thin edge of a pixel segment may be blocked from pixel light transmission. Additionally, it is contemplated that vias should be dispersed over large areas of a display whereby any loss of light that may occur is minimal in any given local region of the display. For instance, vias should not be placed in adjacent pixel segments, or even adjacent pixel triads in an attempt to minimize blockage of light in any local region of a display. The location of pads as shown in FIG. 6 is for reference only to indicate where pads might be located on the longer edges of pixel segments, but in no case, should pads exist in adjacent pixels or pixel segments.

Figure 9A:
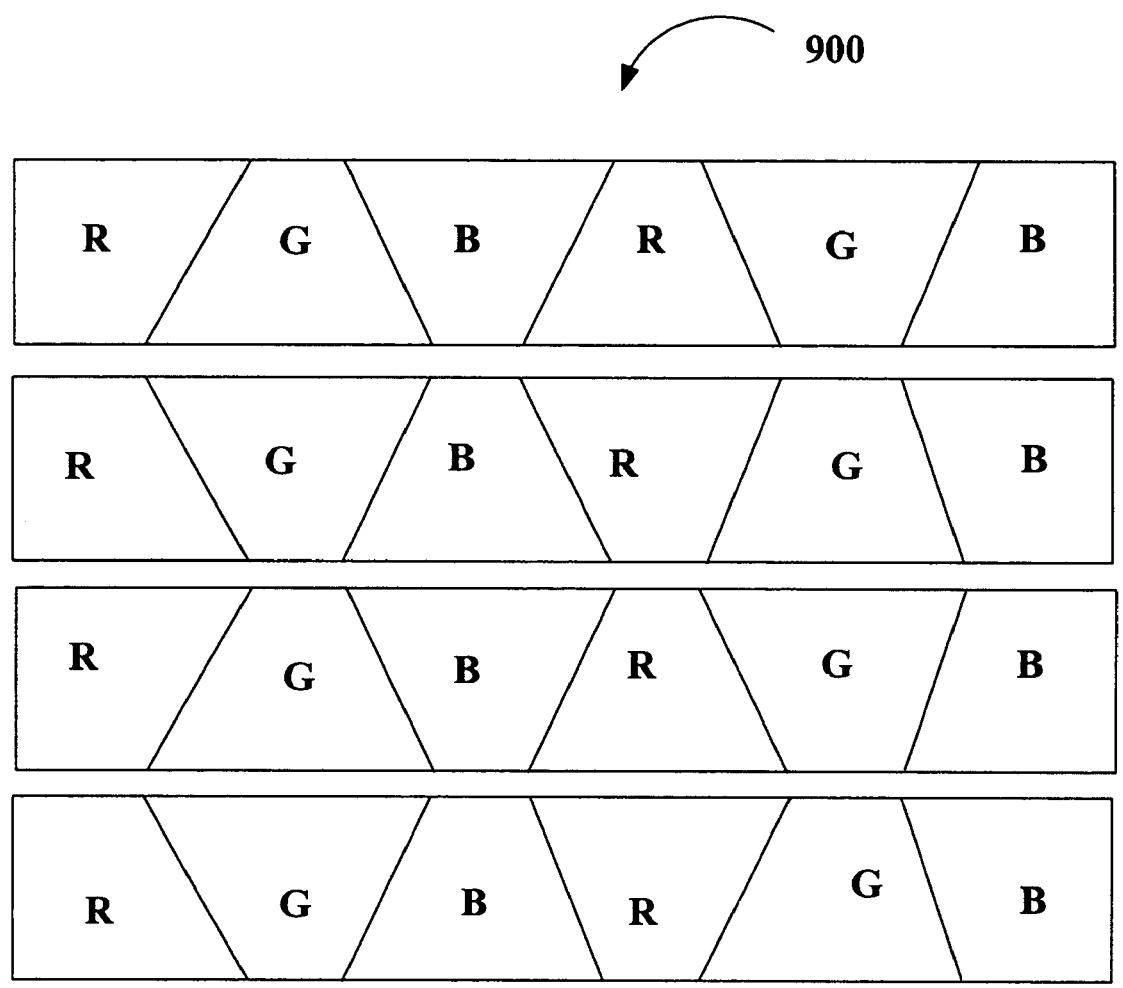
FIG. 9A depicts an embodiment of a pixel array utilizing trapezoidal pixel segment striping in accordance with the present invention.

Rows and columns of pixels may be arranged in several configurations, the placement of vias may similarly be arranged in several configurations whereby vias should be dispersed over large areas of a display such that any loss of light that may occur is minimal in any given local region of the display. Referring generally to FIG. 9A, a pixel array 900 utilizing trapezoidal pixel striping is shown. For example, pixel segments may be arranged having all red, green and blue pixel segments in their own column, achieving rows of uniform pixel segments. A pixel array 900 may be suitable for entire coverage of a display area. Similar patterning may be accomplished by semiconductor processing techniques such as shadow mask manufacturing techniques. Pixel array 900 is assembled according to a substantially full trapezoidal scheme whereby pixels are regular trapezoids, with the exception of the display edges. For instance, the top row of pixel array 900 comprising a green, blue and red segment may combine to form a pixel, the pixel having a regular trapezoidal shape.

Figure 9B:
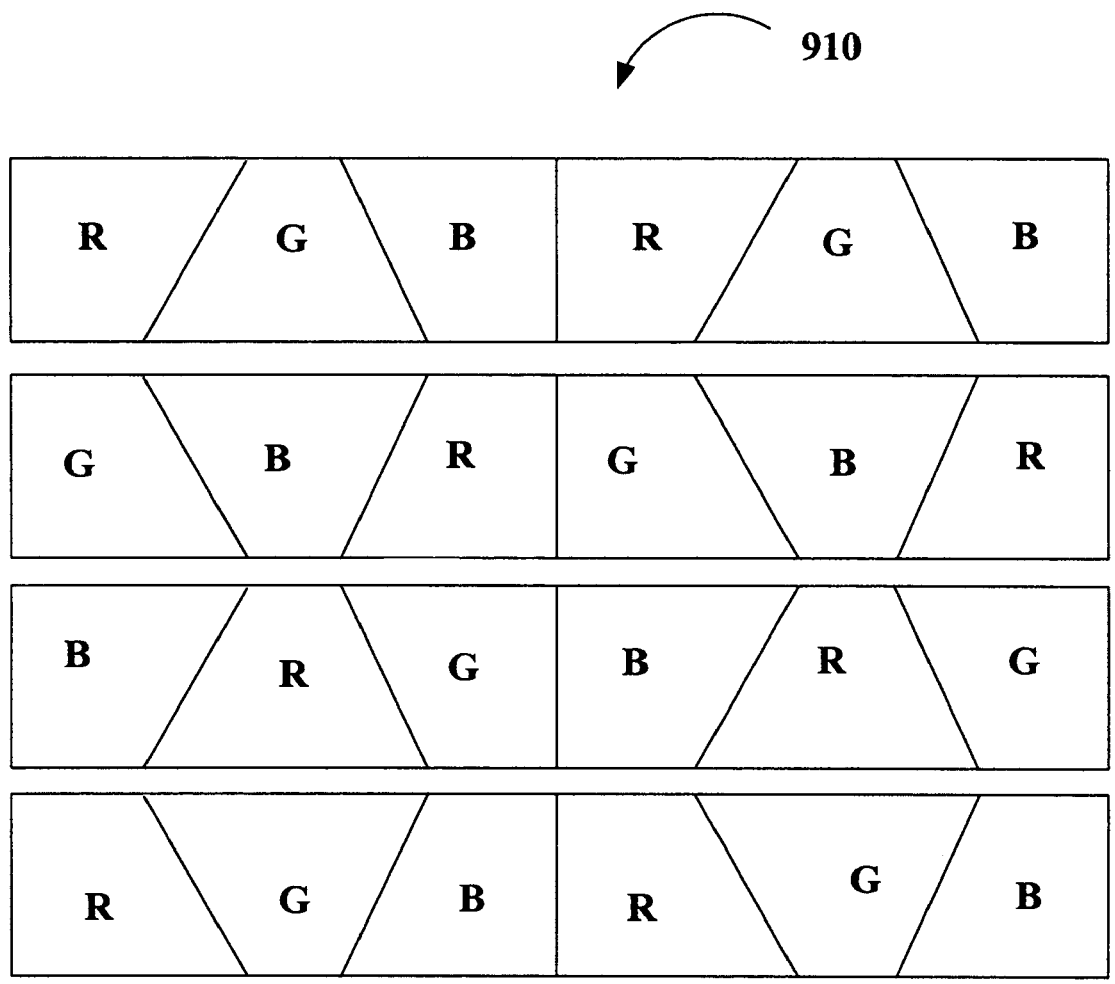
FIG. 9B depicts an embodiment of a pixel array in accordance with the present invention.

Pixel segments may also be arranged to provide some of the image quality anti-aliasing or sub-pixel rendering qualities of other pixels. Referring to FIG. 9B, a pixel array 910 suitable for anti-aliasing or sub-pixel rendering is shown.

Pixel rows are arranged so that a pixel segment in a row is of a different color than a pixel segment located immediately above or below the first segment. For example, if a pixel row in a display begins with a red pixel segment, the row immediately below the first row begins with a green pixel segment, and so on. Alternating initial segment color places pixel segments of different colors in adjacent rows closer together, resulting in high resolution and improved image quality. A pixel arrangement 910 in accordance with the present invention may be compatible with various processes and may be suitable for entire coverage of a display area. Additionally, any of the pixel configurations 910 may be fabricated by ink jet or color filter photolithography methods. Pixel array 910 may be assembled according to a semi-trapezoidal scheme whereby pixels may have a substantially square/rectangular shape with regular and irregular trapezoidal segments. For instance, the top row of pixel array 910 may include a red, green and blue segment which, when combined, form a rectangular shape.

Figure 1A:
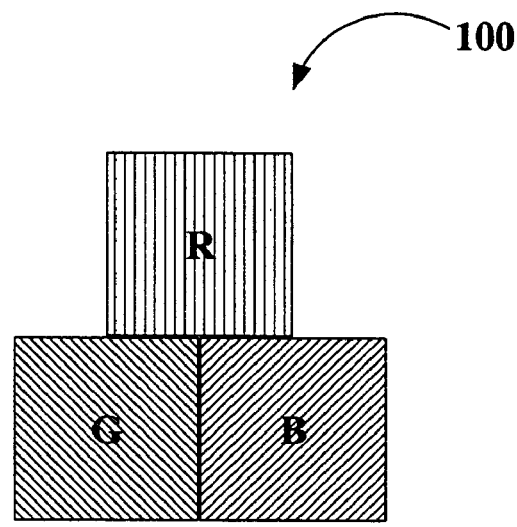
FIG. 1A depicts an embodiment of a conventional delta triad pixel.
Figure 1B:
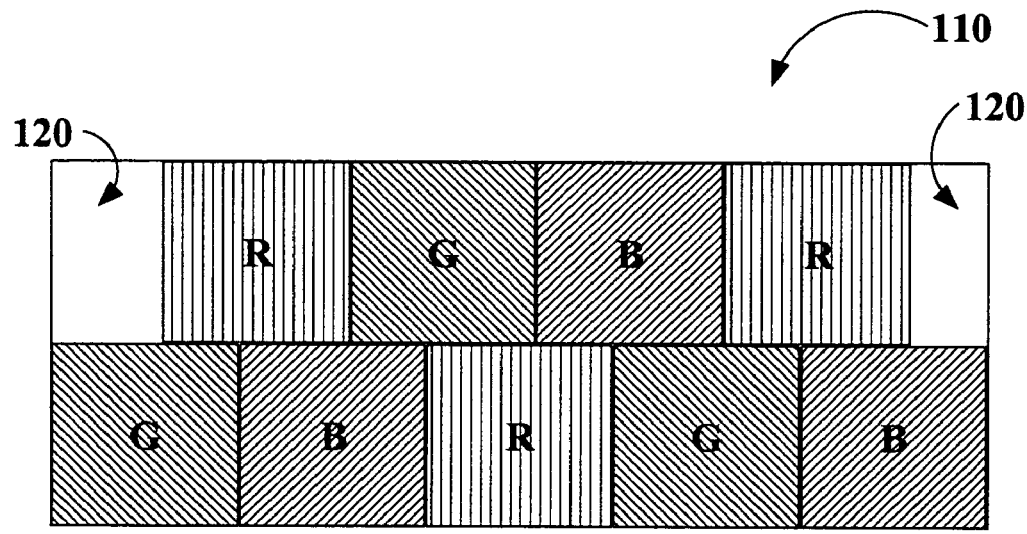
FIG. 1B depicts an embodiment of a conventional delta triad pixel array.
Figure 2:
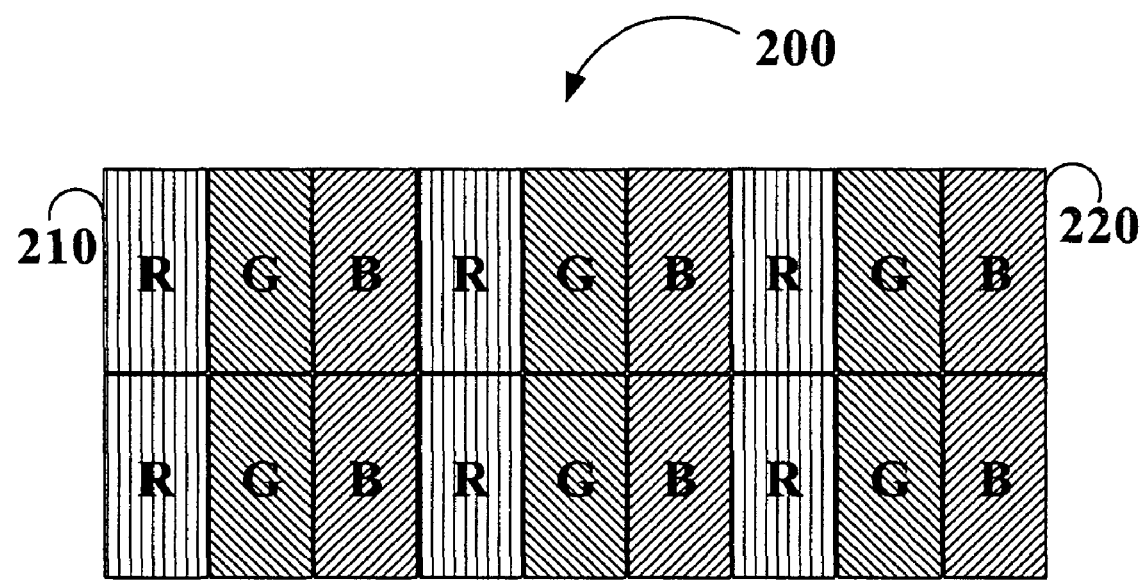
FIG. 2 depicts a conventional rectangular RGB pixel array.
Figure 3:
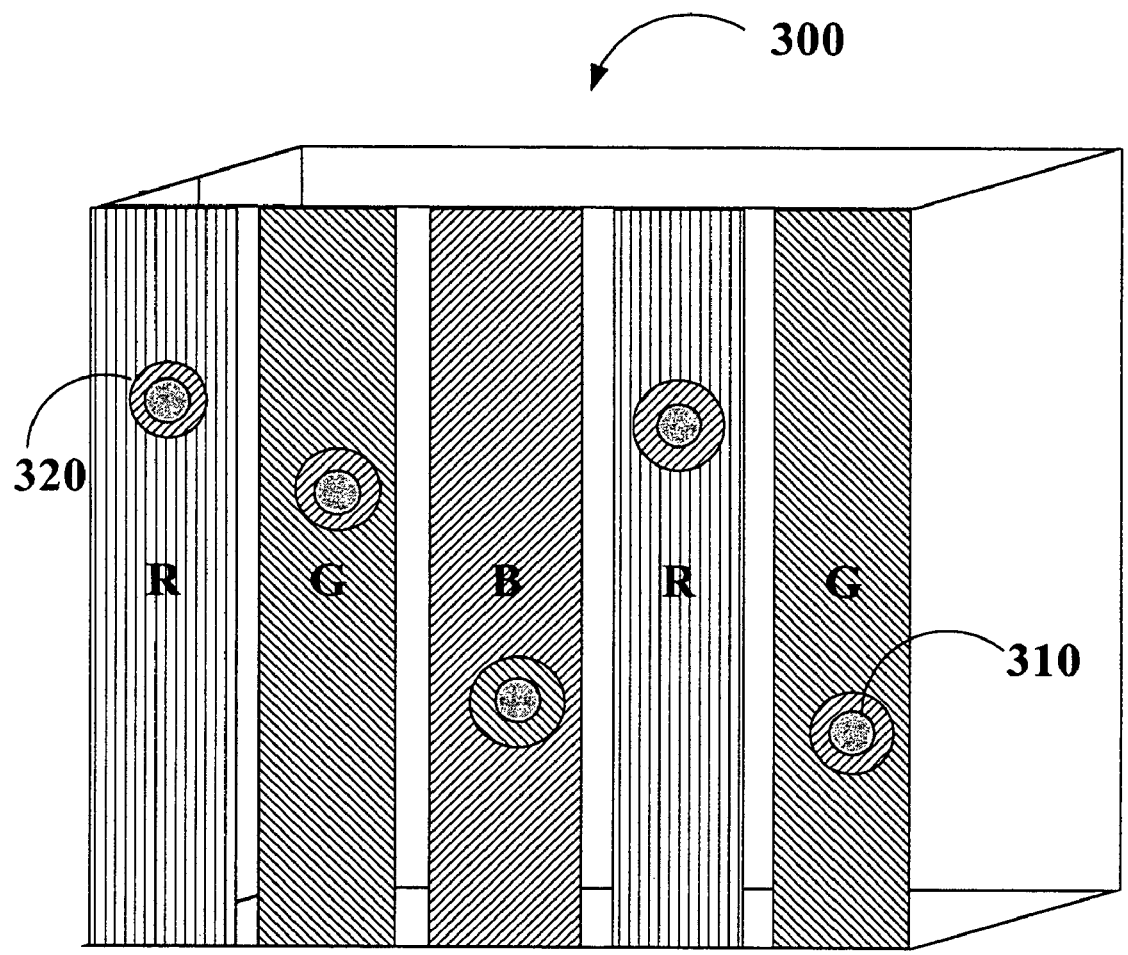
FIG. 3 depicts an embodiment of a conventional rectangular RGB pixel configuration with z-axis interconnections.

An advantageous aspect of the pixel configurations of FIGS. 9A and 9B is the ability to provide entire, or full coverage of a display. As utilized herein, entire, or full coverage of a display may refer to the presence of pixel segments from each edge of a display as shown in FIGS. 9A and 9B, also known as zero-bezel displays by those with ordinary skill in the art. For example, in the instance of a square or rectangular display, a pixel array may provide broader coverage without blank areas that are present in conventional pixel arrays as shown in (FIG. 1B). It should be understood by those with ordinary skill in the art that pixel configurations of FIGS. 9A and 9B may be adjusted to conform within a display of a shape that is not generally rectilinear without departing from the scope and spirit of the present invention.

In a preferred embodiment, a display in accordance with the present invention may be an active matrix organic light emitting diode (OLED) display, which utilizes low density interconnections to produce a high density pixel matrix display structure. Additionally, OLED displays require low voltage drivers but produce high brightness and efficiency. Alternative displays suitable for use with the present invention may be a liquid crystal display (LCD), plasma display electroluminescent display (ELD), vacuum fluorescent display (VFD), or the like.

It is believed that the present invention and many of its attendant advantages will be understood by the foregoing description, and it will be apparent that various changes may be made to the form, construction, arrangement and/or orientation of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A display comprising:
   a substrate;
   a second substrate;
   a pixel array disposed between said substrate and said second substrate; said pixel array including a plurality of pixels of a substantially rectangular shape, said pixel array is arranged in rows of pixels, said pixel array including a plurality of rows of pixels with an area of space between each row of pixels;
   said pixel array being suitable for substantially full coverage of a rectangular area, each pixel having a generally rectangular shape, each pixel consisting of three segments, each segment of said plurality of segments having a unique color; each segment of said plurality of segments having a generally trapezoidal shape;
   at least one pad coupled to said substrate, said at least one pad providing an electrical interconnection for at least one of said three segments; and
   a metal via coupled to said pad, whereby said metal via is capable of receiving instruction regarding pixel illumination; said pad being located on said area of space between each row of pixels.

2. The display as claimed in claim 1, wherein said pixel array is arranged in rows of pixels aligned so that segments of a same color are arranged in columns.

3. The display as claimed in claim 2, wherein said pixel array is arranged so that a segment in said row of pixels is a different color than segments directly above and below said segment.

4. The display as claimed in claim 1, wherein said three segments are configured to provide a desired overall luminous intensity.

5. The display as claimed in claim 4, wherein said desired overall luminous intensity is capable of being provided by adjustment of an area of at least one segment of said three segments.

* * * * *